US 6,351,152 B1
(12) United States Patent
Reddy et al.

(10) Patent No.: US 6,351,152 B1
(45) Date of Patent: *Feb. 26, 2002

(54) LOOK-UP TABLE USING MULTI-LEVEL DECODE

(75) Inventors: Srinivas T. Reddy, Santa Clara; Anil Gupta, San Jose, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/401,743

(22) Filed: Sep. 23, 1999

Related U.S. Application Data

(62) Division of application No. 08/591,121, filed on Jan. 25, 1996, now Pat. No. 6,037,829, which is a continuation of application No. 08/335,628, filed on Nov. 8, 1994, now abandoned, which is a continuation of application No. 08/076,712, filed on Jun. 11, 1993, now Pat. No. 5,438,295.

(51) Int. Cl.$^7$ ............................................. H03K 17/62
(52) U.S. Cl. ...................................... 326/105; 327/408
(58) Field of Search ............................. 327/407, 408, 327/411; 326/105, 106, 107, 108, 109

(56) References Cited

U.S. PATENT DOCUMENTS

| 3,551,900 A | * | 12/1970 | Annis ........................ 340/173 |
| 3,614,327 A | * | 10/1971 | Low ........................... 365/193 |
| 3,633,163 A | * | 1/1972 | Birchmeier ................ 370/216 |
| 3,654,394 A | * | 4/1972 | Gordon ...................... 370/534 |
| 3,760,358 A | * | 9/1973 | Isii et al. ............... 340/825.04 |
| 3,846,745 A | * | 11/1974 | Hill et al. ................. 367/122 |
| 3,885,167 A | * | 5/1975 | Berglund ..................... 377/57 |
| 3,992,703 A | * | 11/1976 | Luisi et al. ................ 365/190 |
| 4,006,470 A | * | 2/1977 | Mitarai ....................... 365/104 |
| 4,103,349 A | * | 7/1978 | Marmet ...................... 365/231 |
| 4,308,526 A | * | 12/1981 | Smith ......................... 341/102 |
| 4,354,266 A | * | 10/1982 | Cooperman et al. ........ 370/537 |
| 4,453,096 A | * | 6/1984 | Le Can ....................... 326/121 |
| 4,470,133 A | * | 9/1984 | Tanimoto ..................... 365/227 |

(List continued on next page.)

FOREIGN PATENT DOCUMENTS

| DE | 24 31 326 | 1/1976 |
| EP | 0 281 867 | 9/1988 |
| EP | 0 314 034 | 5/1989 |
| EP | 0 415 542 A2 | 6/1991 |
| JP | 57-99030 | 6/1982 |
| WO | WO 91/07015 | 5/1991 |

OTHER PUBLICATIONS

Author not listed, "Eight by Sixty–Four to One CMOS Switch Matrix Macro," (1988), vol. 31, No. 5, pp. 316–317.
Davis et al., "Matrix Decoder," (1976) IBM Technical Disclosure Bulletin, vol. 18, No. 8, pp. 2577–2578.
Kubinec, "Build a Programmable Word Generator with MOS ICs. Multiple Output Channels Supply Easily Programmed 100–Bit Words at a 1–MHz Bit Rate," (1969), Electronic Design, vol. 17, No. 2, pp. 62 et seq.
Weste et al., Principles of CMOS VLSI Design, A System Perspective; Addison–Wesley Publishing Co., p. 361.
Yao, "High–Density Memory Selection Circuit," (1972) IBM Technical Disclosure Bulletin, vol. 15, No. 7, pp. 2042–2044.

*Primary Examiner*—Tuan T. Lam
(74) *Attorney, Agent, or Firm*—Townsend and Townsend and Crew LLP

(57) ABSTRACT

A look-up table circuit implemented with MOS transistors that uses combinational logic to generate signals that enable the transistors. A circuit using 16 inputs and 4 select lines is disclosed. Two of the select lines are used as inputs to combinational logic including four NOR gates to generate enable signals for transistors in a third stage of the circuit. This produces a reduction in the propagation delay of a signal from the input to the output of the look-up table circuit.

17 Claims, 4 Drawing Sheets

U.S. PATENT DOCUMENTS

| | | | | |
|---|---|---|---|---|
| 4,491,839 A | * | 1/1985 | Adam | 340/825.91 |
| 4,670,748 A | * | 6/1987 | Williams | 340/825.84 |
| 4,725,742 A | * | 2/1988 | Tachimori et al. | 326/106 |
| 4,873,459 A | * | 10/1989 | El Gamal et al. | 326/41 |
| 4,879,684 A | * | 11/1989 | Krauss et al. | 365/189.11 |
| 4,910,466 A | * | 3/1990 | Kiuchi | 327/99 |
| 4,916,336 A | * | 4/1990 | Houston | 326/108 |
| 4,972,380 A | * | 11/1990 | Hidaka et al. | 365/230.06 |
| 4,975,601 A | * | 12/1990 | Steele | 326/38 |
| 5,012,126 A | * | 4/1991 | Feldbaumer | 327/410 |
| 5,021,689 A | * | 6/1991 | Pickett et al. | 365/185.28 |
| 5,122,685 A | * | 6/1992 | Chan et al. | 326/41 |
| 5,157,283 A | * | 10/1992 | Kin | 326/106 |
| 5,162,666 A | * | 11/1992 | Tran | 327/408 |
| 5,163,020 A | * | 11/1992 | Chau | 708/714 |
| 5,200,907 A | * | 4/1993 | Tran | 326/113 |
| 5,231,588 A | * | 7/1993 | Agrawal et al. | 326/41 |
| 5,243,599 A | * | 9/1993 | Barrett et al. | 370/541 |
| 5,280,202 A | * | 1/1994 | Chan et al. | 326/37 |
| 5,309,045 A | * | 5/1994 | Saeki et al. | 326/39 |
| 5,315,178 A | | 5/1994 | Snider | 326/44 |
| 5,327,022 A | * | 7/1994 | Yamada et al. | 326/21 |
| 5,343,406 A | | 8/1994 | Freeman et al. | 716/16 |
| 5,369,621 A | | 11/1994 | Mason | 365/230.06 |
| 5,432,719 A | | 7/1995 | Freeman et al. | 326/38 |
| 5,436,574 A | * | 7/1995 | Veenstra | 326/39 |
| 5,438,295 A | | 8/1995 | Reddy et al. | 327/408 |
| 5,488,316 A | * | 1/1996 | Freeman et al. | 326/41 |

\* cited by examiner

LOOK-UP TABLE USING MULTI-LEVEL DECODE

This application is a divisional of and claims the benefit of U.S. patent application Ser. No. 08/591,121, filed Jan. 25, 1996, now allowed, U.S. Pat. No. 6,057,829, which is a continuation of U.S. patent application Ser. No. 08/335,628, filed Nov. 8, 1994, now abandoned, which is a continuation of U.S. patent application Ser. No. 08/076,712 filed Jun. 11, 1993, now U.S. Pat. No. 5,438,295, the disclosures of which are incorporated by reference.

FIELD OF THE INVENTION

This invention relates generally to electronic look-up table circuits and specifically to a look-up table circuit that uses combinational logic to generate internal enable signals in a programmable logic array application.

BACKGROUND OF THE INVENTION

Look-up table circuits are well known in the art for selecting one of several signal inputs and passing the selected signal input to the output of the circuit. Look-up tables are widely used in applications such as communications, digital computing, control systems, etc.

FIG. 1 shows a block diagram of a look-up table 100 having signal inputs 102, select lines 104 and output 106. In operation, signal inputs 102 are applied with electrical signals in the form of, e.g., digital data, represented by high and low voltages corresponding, respectively, to 1's and 0's. Select lines 104 are similarly applied with high or low signals. The specific pattern of high or low signals at select lines 104 determines which of signal inputs 102 is connected to output 106. Once the connection is made between a signal input and the output, or, equivalently, a signal is selected and "passed" to the output, the passed signal is then available at the output after a short delay. Signal inputs are, typically, outputs from a memory element such as random access memory (RAM) or read-only memory (ROM).

As an example, assume that only select lines 108 and 112 are used. Further, assume that there are only four signal inputs 102. A common operation of the look-up table is then as follows: When select line 108 and select line 112 are both low, input 114 is passed to output 106. When select line 108 is low and select line 112 is high, input 116 is passed to output 106. When select line 108 is high and select line 112 is low, input 118 is passed to output 106. Finally, when select line 108 and select line 112 are both high, signal input 120 is passed to output 106. Thus, by using a binary numbering scheme at the select lines 104, signal inputs are passed to the output according to their number corresponding with their position from top to bottom in FIG. 1.

FIG. 2 is a schematic diagram of a prior art look-up table circuit. In FIG. 2, look-up table circuit 150 includes select lines A, B, C and D at 152, signal inputs R0–15 at 154 and outputs, LOUT, at 156.

In the circuit of FIG. 2, voltages in the form of digital signals are applied to signal inputs 154 and select lines 152. For example, in a typical implementation, the voltages may correspond to 0 volts for a "low" and 5 volts for a "high." With a low voltage corresponding to a "0" binary digit and a high voltage corresponding to a "1" binary digit there are 16 possible combinations of voltages that can be applied to select lines 152 to select one of the 16 signal inputs 154 as shown in Table I below.

TABLE I

| DCBA | LOUT |
| --- | --- |
| 1111 | R0 |
| 1110 | R1 |
| 1101 | R2 |
| 1100 | R3 |
| 1011 | R4 |
| 1010 | R5 |
| 1001 | R6 |
| 1000 | R7 |
| 0111 | R8 |
| 0110 | R9 |
| 0101 | R10 |
| 0100 | R11 |
| 0011 | R12 |
| 0010 | R13 |
| 0001 | R14 |
| 0000 | R15 |

As shown in Table I, where select lines A, B, C and D are each supplied with a high voltage, the signal input R0 is the signal seen at the output 156, LOUT. This can be verified by tracing signal input R0 to transistor 158. Since select line A is high, transistor 158 will be on and signal input R0 will be passed to transistor 160. Since select line B is high, signal input R0 will further be passed to transistor 162. Likewise, select lines C and D are high so that transistors 162, 164 will pass signal input R0 to LOUT at 156.

The transistors are grouped into four stages corresponding to the order in which a signal passes through the transistors. First stage 176 includes transistor 158, second stage 178 includes transistor 160, third stage 180 includes transistor 162 and fourth stage 182 includes transistor 164.

In the circuit of FIG. 2, each of the transistors 152, 160, 162 and 164 that passes signal input R0 to LOUT introduces a delay referred to as a "transistor delay." In a typical metal-oxide-semiconductor ("MOS") implementation, a single transistor delay is about 0.3 nS. Thus, the total propagation delay through the circuit of FIG. 2 is 1.2 nS.

A second example to illustrate the performance of the look-up table circuit of FIG. 2 assumes that the select lines have the value "1110" so that select lines D, C and B are high while select line A is low. This means that signal input R1 will be passed to LOUT. However, in order for signal input R1 to be passed to LOUT, transistor 174 must be on. Since select line A is low at the input to inverter 172 the gate of transistor 174 will be high so that transistor 174 is on.

An MOS inverter such as inverter 166, 168, 170 or 172 each has an inverter delay or about 0.5 Ns. In the cases where an inverted select line signal is used to pass a signal input, the delay of the inverter must be taken into account. Thus, where signal input R1 is passed through transistor 174 by enabling the gate of transistor 174 with the output of inverter 172, the delay in the first stage is the time required to turn transistor 174 on (0.5 nS) plus the transistor delay time in passing the signal from the source to the drain (0.3 nS). This gives a total time through a first stage transistor with an inverted select line signal at its gate of 0.8 nS.

The inverter delay of 0.5 nS is not a factor in later stages 2, 3 or 4 since after the first 0.5 nS of operation of the circuit the output of each inverter is available. This is because the select line signals propagate through the inverters "concurrently" or "in parallel." Thus, later stages only introduce a single transistor delay of 0.3 Ns. This means that the worst case total delay in passing a signal input to the output is about 1.7 nS. The general "best case" delay, for purposes of this discussion, is about 1.2 nS which occurs when a signal is passed through transistors that do not have an inverted select line controlling the transistor gate in the first stage. (A "special best case" delay not considered in this discussion occurs when select line D goes from low to high while select lines A, B and C do not change. This introduces only a 0.3 nS delay through transistor 164 before the signal at output 156 is valid.)

Thus, it is seen in the prior art circuit of FIG. 2 that the delay in selecting a signal and making the signal available at the output, LOUT, is in the range of 1.2 nS to 1.7 nS. Naturally, it is desirable to reduce this delay as much as possible.

SUMMARY OF THE INVENTION

The present invention is a look-up table circuit that provides for a reduced lay time in selecting and passing a signal input to the output. The invention includes combinational means such as NOR gates to derive signals based on two or more select lines. The output of the combinational means is used to enable transistors to pass the selected signal to the output.

A preferred embodiment implements a 16 input look-up table by having two of the four select lines used to derive inputs to four NOR gates. The resulting circuit requires only three transistor stages and thus reduces the delay time over prior art circuits such as the circuit of FIG. 2.

DESCRIPTION OF THE PREFERRED EMBODIMENT

Figure 1:
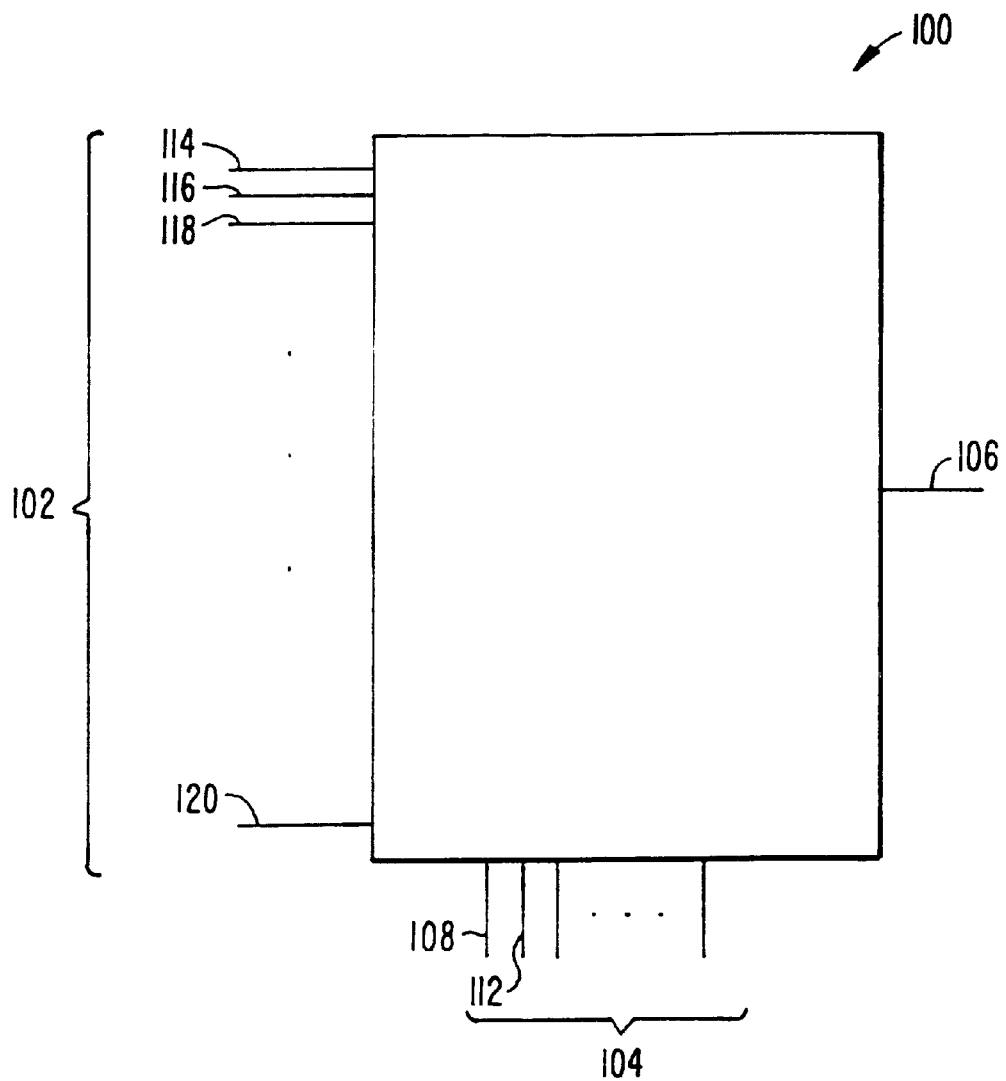
FIG. 1 is a block diagram of a look-up table showing signal inputs, select lines and an output.
Figure 2:
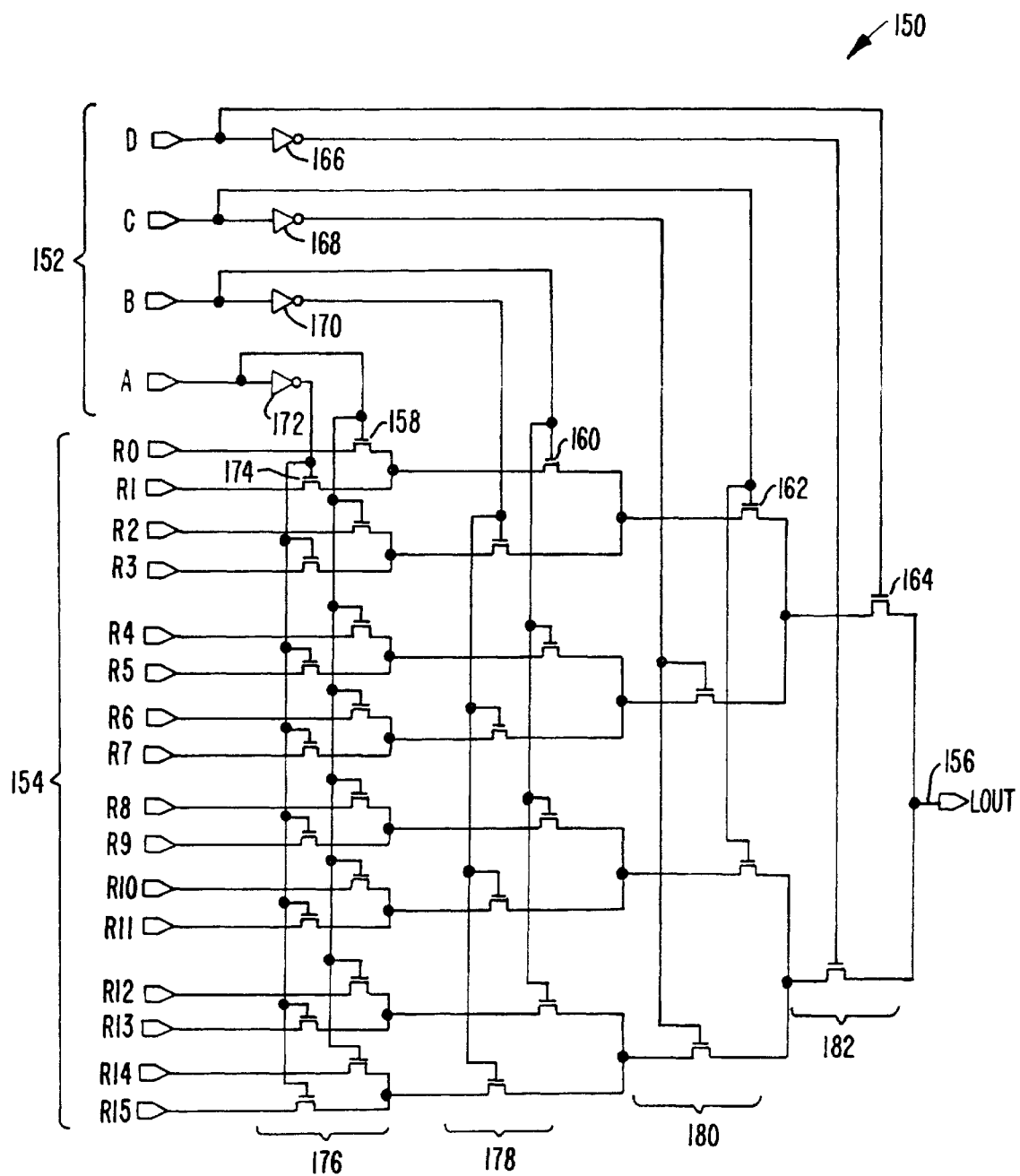
FIG. 2 is a prior art look-up table circuit.
Figure 3:
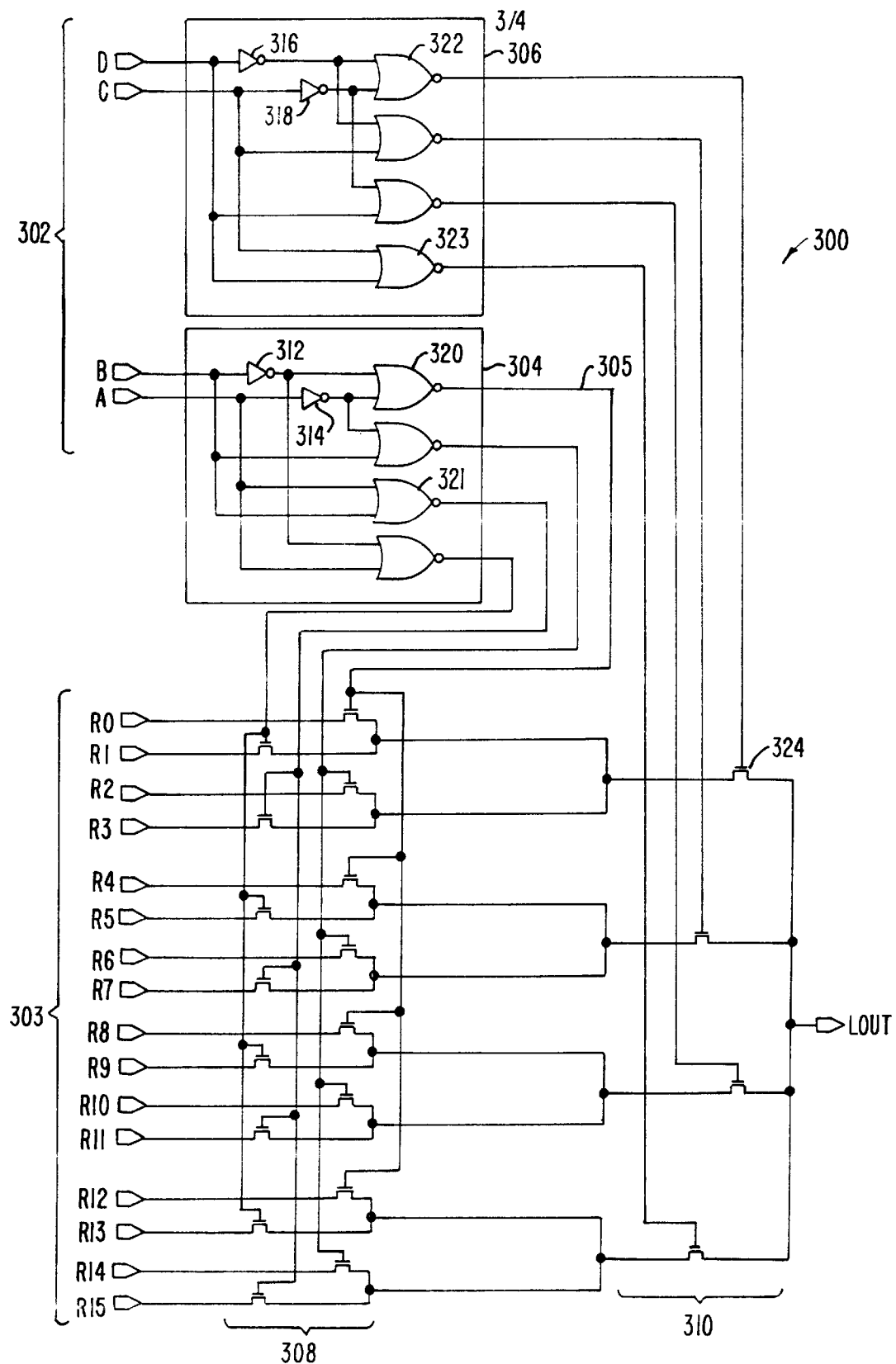
FIG. 3 shows a look-up table circuit of the present invention having two transistor stages.

FIG. 3 shows a first implementation of a look-up table circuit of the present invention. Note that select lines 302 labeled A, B, C and D are inputs to combinational subcircuits 304 and 306 and there are only two transistor stages 308 and 310. Subcircuits 304 and 306 output enable signals coupled to the gates of first and second stage transistors to turn these transistors on or off. The circuit of FIG. 3 performs according to Table I, above, as discussed in connection with FIG. 2.

To illustrate the performance of FIG. 3 assume that select lines A, B, C and D are all high. NOR gates such as 320 of subcircuit 304 will output a high signal only when both of the inputs to the NOR gate are low. Since select lines A and B are both high, it is shown from the schematic of subcircuit 304 in FIG. 3 that only NOR gate 320 will output a high signal since each of the other NOR gates in subcircuit 304 has an input either uninverted select line A or uninverted select line B. Thus, four of the signal inputs, namely, R0, R4, R8 and R12 are passed through first stage 308 of FIG. 3.

Similar to subcircuit 304, subcircuit 306 includes four NOR gates whose inputs are connected to signals derived from the select lines. In subcircuit 306, since select lines C and D are both high, NOR gate 322 is the only NOR gate outputing a high signal. This means that only transistor 324 will have a high voltage at its gate and will pass its signal to LOUT. This passed signal is R0.

It is similarly shown that other combinations of high and low voltages on select lines A, B, C and D will result in a different signal input being passed to the output in accordance with Table I above.

Note that the total delay of the circuit of FIG. 3 differs from the prior art circuit of FIG. 2. Each signal input 303 only passes through two transistor stages before reaching the output, LOUT, and, hence, there are only two transistor delays. However, there is a longer delay in obtaining enable signals from the subcircuits 304 and 306 to turn the transistors on. In the worst case an enable signal such as enable signal 305 requires an inverter gate delay and a NOR gate delay before enable signal 305 is valid. As discussed above, an inverter delayed is approximately 0.5 nS. A NOR gate delay is also approximately 0.5 nS. This means that the worst case delay for a valid enable signal, such as enable signal 305, is 1.0 nS. The worst case delay for a signal to propagate through first stage 308 is, therefore, about 1.3 nS.

The propagation delay through second stage 310 of FIG. 3 will be only one transistor delay since, for example, by the time the first stage delay output is valid at transistor 324 the signal at the gate of transistor 324 is also valid since the combinational means implemented by subcircuit 306 operates in parallel with subcircuit 304. This means that there is no delay introduced into the second stage as a result of waiting for signals at the gates of the transistors in second stage 310 to become valid. The delay added by second stage 310 is about 0.3 nS giving a total worst case delay time of 1.6 nS.

The best case delay through the first stage occurs when select lines A and B are both low so that the controlling enable signal is generated by NOR gate 321 which doesn't use outputs from inverters 312 or 314. In this case, the delay through first stage 308 is 0.8 nS. Through the second stage, the best case delay is 1.1 nS which assumes the case where the enable signal from subcircuit 306 is not generated from a NOR gate with inputs coupled to the inverted select lines, i.e., select lines C and D are both low. In computing the second stage delay, note that the delay through NOR gate 323 occurs in parallel with the delay through NOR gate 321 and, hence, does not contribute to the total delay.

It is thus shown that, in the look-up table circuit of FIG. 3, the total delay in passing the signal input to the output is in the range 1.1 nS to 1.6 nS. This is the better than the prior art circuit of FIG. 2.

Figure 4:
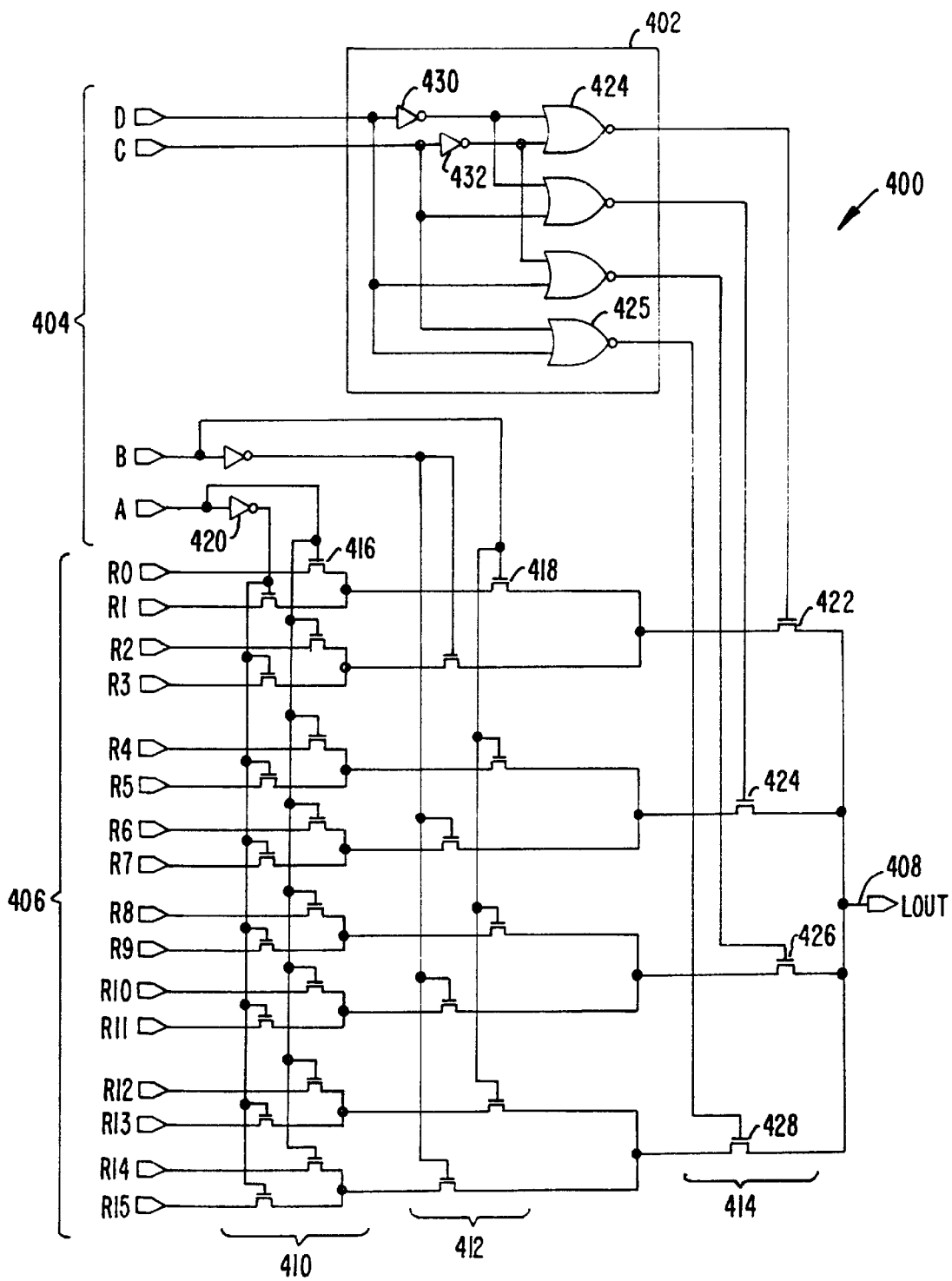
FIG. 4 is a look-up table circuit of the present invention having three transistor stages.

FIG. 4 shows look-up table circuit 400 that is another, preferred, embodiment of the present invention. The embodiment of FIG. 4 only uses one subcircuit 402 instead of the two subcircuits used in the circuit of FIG. 3 above. As before, the look-up table circuit of FIG. 4 includes select lines at 404, signal inputs at 406 and an output at 408. The circuit of FIG. 4 has three transistor stages, first stage 410, second stage 412 and third stage 414. The circuit of FIG. 4 operates in accordance with Table I above.

To illustrate the performance of FIG. 4, assume that select lines A and B are high. This results in signal inputs R0, R2, R4, R6, R8, R10, R12 and R14 in being passed through first stage 410. The time required for the signals to propagate through the first stage is one transistor delay, or 0.3 nS.

Second stage 412 introduces, at most, another 0.3 nS single transistor delay since the inverted select line B enabling signals will already be present at stage two having been concurrently derived with select line A signals. In the example, signals R0, R4, R8 and R12 are passed through the second stage with a delay of 0.6 nS.

At third stage 414, the enable signals to turn on transistors 422, 424, 426 and 428 are the outputs of subcircuit 402. Subcircuit 402, like subcircuits 304 and 306, is a combinational circuit using inverters and NOR gates to generate enable signals for transistors in stage three at 414. The minimum delay for valid enable signals is when select lines C and D are both low. This results in a high signal at the output of NOR gate 425 after 0.5 nS delay. Since this 0.5 nS delay is concurrent with the delay through the first and second stages, the delay attributable to NOR gate 425 is inconsequential. The high signal output from NOR gate 425 is applied to the gate of transistor 428 to select R12, in the present example, after a transistor delay of 0.3 nS. Thus, the best case delay, which occurs when select lines C and D are low and select lines A and B are high, is 0.9 nS for the circuit of FIG. 4.

To analyze the worst case delay for the circuit of FIG. 4, assume that select line A is low. Then inverter 420 causes a delay of about 0.5 nS resulting in a 0.8 nS worst case delay through the first stage. The worst case propagation delay in combined stages one and two is therefore 1.1 nS. The maximum delay for valid enable signals appearing at the outputs of subcircuit 402 is 1.0 nS, when both select lines C and D are high. However, since the delay from stages one and two is 1.1 nS in the worst case, the delay attributable to subcircuit 402 does not affect the worst case total delay. In other words, the outputs of subcircuit 402 will be valid by the time the selected signal input has propagated to the third stage transistors at 414. Thus, stage three at 414 will add 0.3 nS delay for a total of 1.4 nS total delay time in the worst case. This means that will all select lines high, the time to propagate R0 to LOUT is 1.4 nS.

Thus, the circuit of FIG. 4 provides a look-up table circuit with delay times in the range of 0.9 nS to 1.4 nS. This is a marked improvement over the prior art.

Note that other combinational means may be used in place of subcircuit 402 of FIG. 4 and subcircuits 304 and 306 of FIG. 3. For example, NOR gate 424 can be substituted with an AND gate with inputs connected directly to select lines C and D without going through inverters 430 and 432. However, inverters and NOR gates are the preferred devices since they are easier and more economical to fabricate on a semiconductor chip.

In the foregoing specification, the invention has been described with reference to a specific, exemplary embodiment thereof. It will, however, be evident that various modifications and changes may be made there onto without departing from the broader spirit and scope of the invention as set forth in the appended claims. The figures in this specification apply for a typical CMOS process and will be different depending on the technology used to fabricate the look-up table device. Other transistor technologies such as bipolar may be used to implement the circuits of the present invention. Further, the circuit may be operated at voltages other than those specifically disclosed herein without departing from the scope of the invention. The circuit may also be used to implement a "multiplexer" function. Many such changes or modifications will be readily apparent to one of ordinary skill in the art.

The specifications and drawings are, accordingly, to be regarded in an illustrative rather than a restrictive sense, the invention being limited only by the provided claims.

What is claimed is:

1. A method of implementing logical functions in an integrated circuit comprising:
    providing a plurality of signal inputs;
    providing a plurality of selection inputs;
    in combinational logic, generating combinational outputs from the selection inputs, the combinational outputs comprising a first set of combinational outputs and a second set of combinational outputs, the combinational logic comprising a first combinational logic circuit used to provide the first set of combinational outputs to a first stage of pass gates and a second combinational logic circuit used to provide the second set of combinational outputs to a second stage of pass gates; and
    using the combinational outputs to pass or not pass selected ones of the signal inputs through the pass gates based on values input to the selection inputs, wherein at least one of the signal inputs is passed through the pass gates to a circuit output; and
    wherein there are "n" selection inputs and "$2^n$" signal inputs, where "n">1.

2. The method of claim 1 wherein a set of selection inputs from the plurality of selection inputs are input to the combinational logic and selection inputs from the plurality of selection inputs not included in the set are coupled directly to the pass gates.

3. The method of claim 1 wherein the combinational logic comprises:
    a first plurality of NOR gates coupled to the first stage of pass gates; and
    a second plurality of NOR gates coupled to the second stage of pass gates.

4. The method of claim 1 wherein the combinational logic comprises a plurality of NOR gates, each coupled to a different pass gate of the first and the second stages of pass gates.

5. The method of claim 1 wherein the combinational logic comprises:
    a first block comprising:
        a first NOR gate coupled to a first pass gate of the first stage of pass gates;
        a second NOR gate coupled to a second pass gate of the first stage of pass gates;
        a third NOR gate coupled to a third pass gate of the first stage of pass gates; and
        a fourth NOR gate coupled to a fourth pass gate of the first stage of pass gates; and
    a second block comprising:
        a first NOR gate coupled to a first pass gate of the second stage of pass gates;
        a second NOR gate coupled to a second pass gate of the second stage of pass gates;
        a third NOR gate coupled to a third pass gate of the second stage of pass gates; and
        a fourth NOR gate coupled to fourth pass gate of the second stage of pass gates.

6. The method of claim 1 wherein each of the selection inputs is inverted and not inverted, selected ones of the inverted signals are used as selected inputs to NOR gates, and the not inverted signals are used as selected inputs to the NOR gates.

7. A look-up table circuit for an integrated circuit comprising:
    a plurality of n selection inputs;
    a plurality of $2^n$ signal inputs;
    a plurality of $2^n$ pass gates in a first stage;
    a plurality of $2^{(n-2)}$ pass gates in a second stage, wherein one of the $2^n$ signal inputs is passed through the first stage and the second stage to an output of the look-up table circuit for each combination of the n selection inputs; and
    a plurality of (2*n) combinational gates coupled to the first stage and the second stage of pass gates.

8. The look-up table circuit of claim 7 wherein the plurality of (2*n) combination gates comprises:
    a first NOR gate coupled to a first pass gate of the first stage of pass gates;
    a second NOR gate to a second pass gate of the first stage of pass gates;
    a third NOR gate coupled to a third pass gate of the first stage of pass gates; and
    a fourth NOR gate coupled to a fourth pass gate of the first stage of pass gates; and a fifth NOR gate coupled to a first pass gate of the second stage of pass gates;

a sixth NOR gate coupled to a second pass gate of the second stage of pass gates;

a seventh NOR gate coupled to a third pass gate of the second stage of pass gates; and a eighth NOR gate coupled to a fourth pass gate of the second stage of pass gates.

9. A look-up table circuit for an integrated circuit comprising:

a plurality of n selection inputs;

a plurality of $2^n$ signal inputs;

a plurality of $2^n$ pass gates in a first stage;

a plurality of $2^{(n-1)}$ pass gates in a second stage;

a plurality of $2^{(n-2)}$ pass gates in a third stage, wherein one of the $2^n$ signal inputs is passed through the first stage, the second stage, and the third stage to an output of the look-up table circuit for each combination of the n selection inputs; and a plurality of combinational gates coupled to the third stage of pass gates.

10. The look-up table circuit of claims 7 or 9 wherein the combinational gates are NOR gates.

11. The look-up table circuit of claim 9 wherein $2^{(n-2)}$ pass gates from the plurality of $2^{(n-1)}$ pass gates in the second stage are directly coupled to one of the selection inputs, and other pass gates in the second stage are coupled to a complementary signal of the one of the selection inputs.

12. The look-up table circuit of claim 9 wherein $2^{(n-1)}$ pass gates from the plurality of $2^n$ pass gates in the first stage are directly coupled to one of the selection inputs, and other pass gates in the first stage are coupled to a complementary signal of the one of the selection inputs.

13. A programmable logic integrated circuit comprising a logical function implemented using circuitry as recited in claims 7 or 9.

14. A method of implementing logical functions in an integrated circuit comprising:

receiving a plurality of signal inputs;

receiving a plurality of selection inputs;

providing "m" selection stages, each selection stage comprising a set of pass gates, the "m" selection stages including a first selection stage, wherein "m">2;

providing a combinational logic circuit configured to receive a first set of selection inputs from the plurality of selection inputs, the combinational logic circuit configured to generate combinational outputs based upon the first set of selection inputs and to provide the combinational outputs to pass gates in the first selection stage; and using the combinational outputs and the selection inputs to pass or not pass selected ones of the signal inputs through pass gates of the plurality of selection stages based on values input to the selection inputs, wherein at least one of the signal inputs is passed through the pass gates of the plurality of selection stages to a circuit output.

15. The method of claim 14 wherein there are "n" selection inputs and $2^n$ signal inputs, where "n"≧2.

16. A method of implementing logical functions in an integrated circuit comprising:

receiving a plurality of signal inputs;

receiving a plurality of selection inputs;

providing a plurality of selection stages, each selection stage comprising a set of pass gates, the plurality of selection stages including a first selection stage and a second selection stage;

providing a first combinational logic circuit configured to receive a first set of selection inputs from the plurality of selection inputs, the first combinational logic circuit configured to generate a first set of combinational outputs based upon the first set of selection inputs and to provide the first set of combinational outputs to pass gates in the first selection stage;

providing a second combinational logic circuit configured to receive a second set of selection inputs from the plurality of selection inputs, the second combinational logic circuit configured to generate a second set of combinational outputs based upon the second set of selection inputs and to provide the second set of combinational outputs to pass gates in the second selection stage;

using the first set of combinational outputs to pass a first set of signal inputs from the plurality of signal inputs through pass gates of the first selection stage based on values of the first set of selection inputs; and using the second set of combinational outputs to pass a second set of signal inputs from the first set of signal inputs through pass gates of the second selection stage based on values of the second set of selection inputs, wherein at least one of the signal inputs from the second set of signal inputs is passed to a circuit output; and wherein there are "n" selection inputs and "$2^n$" signal inputs, where "n">1.

17. A method of implementing logical functions in an integrated circuit comprising:

providing a plurality of signal inputs;

providing a plurality of selection inputs;

in combinational logic, generating combinational outputs from the selection inputs, the combinational outputs comprising a first set of combinational outputs and a second set of combinational outputs, the combinational logic comprising a first combinational logic circuit used to provide the first set of combinational outputs to a first stage of pass gates and a second combinational logic circuit used to provide the second set of combinational outputs to a second stage of pass gates; and using the combinational outputs to pass or not pass selected ones of the signal inputs through the pass gates based on values input to the selections inputs, wherein at least one of the signal inputs is passed through the pass gates to a circuit output; and wherein the combinational logic comprises:

a first block comprising:

a first NOR gate coupled to a first pass gate of the first stage of pass gates;

a second NOR gate coupled to a second pass gate of the first stage of pass gates;

a third NOR gate coupled to a third pass gate of the first stage of pass gates; and a fourth NOR gate coupled to a fourth pass gate of the first stage of pass gates; and a second block comprising:

a first NOR gate coupled to a first pass gate of the second stage of pass gates;

a second NOR gate coupled to a second pass gate of the second stage of pass gates;

a third NOR gate coupled to a third pass gate of the second stage of pass gates; and a fourth NOR gate coupled to fourth pass gate of the second stage of pass gates.

* * * * *

UNITED STATES PATENT AND TRADEMARK OFFICE
CERTIFICATE OF CORRECTION

PATENT NO. : 6,351,152 B1
DATED : February 26, 2002
INVENTOR(S) : Srinivas T. Reddy and Anil Gupta It is certified that error appears in the above-identified patent and that said Letters Patent is hereby corrected as shown below:

Column 6,
Line 62, insert -- coupled -- after the first occurrence of "gate".

Column 8,
Line 44, replace "selections" with -- selection --.

Signed and Sealed this

Eleventh Day of February, 2003

JAMES E. ROGAN
*Director of the United States Patent and Trademark Office*